United States Patent
Hertz

(10) Patent No.: US 7,113,762 B1
(45) Date of Patent: Sep. 26, 2006

(54) ELECTRONIC COMPONENT SUPPORT STRUCTURE SYSTEM FOR SUPPORTING STANDARD-CONFORMING AND NON-STANDARD-CONFORMING ELECTRONIC COMPONENTS

(76) Inventor: Eli Hertz, 24 Greenway South Forest Hills Garden, New York, NY (US) 11375

( * ) Notice: Subject to any disclaimer, the term of this patent is extended or adjusted under 35 U.S.C. 154(b) by 0 days.

(21) Appl. No.: 09/522,804

(22) Filed: Mar. 10, 2000

(51) Int. Cl.
*H05H 7/20* (2006.01)

(52) U.S. Cl. .................................. 455/349; 361/600
(58) Field of Classification Search .................. 361/600, 361/679, 724, 728, 727, 814; 455/683, 347, 455/348, 349, 90
See application file for complete search history.

(56) References Cited

U.S. PATENT DOCUMENTS

| | | | |
|---|---|---|---|
| 2,935,210 A | 5/1960 | Cohen | 211/147 |
| 3,255,722 A | 6/1966 | Ferdinand et al. | 108/144 |
| 4,186,666 A | 2/1980 | Honickman | 108/29 |
| 4,450,775 A | 5/1984 | Brendle | 108/64 |
| 5,127,340 A | 7/1992 | Maro et al. | 108/107 |
| 5,350,073 A | 9/1994 | Thornley et al. | 211/187 |
| 5,806,417 A | 9/1998 | Whiten et al. | 108/106 |
| 6,422,399 B1 * | 7/2002 | Castillo et al. | 211/26 |
| 6,469,899 B1 * | 10/2002 | Hastings et al. | 361/724 |

* cited by examiner

*Primary Examiner*—Thanh Cong Le
*Assistant Examiner*—Nick Corsaro
(74) *Attorney, Agent, or Firm*—Ostrolenk, Faber, Gerb & Soffen, LLP

(57) ABSTRACT

An electrical component support structure which supports both standard-conforming and non-standard-conforming electrical components has fixed support structure which supports movable intermediate support structure to which electronic components conforming to a predefined width standards are mounted. The intermediate support structure can be located at a number of locations within the fixed support structure to provide for various arrangements of conforming electronic components and can be configured to support components conforming to more than one predefined standard Electronic components not conforming to a predefined standard are supported on shelves mounted to the fixed support structure, which shelves can be mounted in a number of positions. The conforming telecommunication component includes a mounting panel having first and second vertical edges and panel mounting holes located adjacent each of the first and second vertical side edges.

7 Claims, 2 Drawing Sheets

ELECTRONIC COMPONENT SUPPORT STRUCTURE SYSTEM FOR SUPPORTING STANDARD-CONFORMING AND NON-STANDARD-CONFORMING ELECTRONIC COMPONENTS

FIELD OF THE INVENTION

The invention pertains to the field of support structures for electronic components, and in particular to support structures for electronic components conforming to a predefined standard.

BACKGROUND AND SUMMARY OF THE INVENTION

Electronic components, and telecommunications components in particular, are typically supported in open or enclosed support structures to organize and protect the components. The support structures include spaced-apart, vertically-aligned mounting flanges with a series of mounting holes for mounting the electronic components. The electronic components include panels with mounting slots, which align with the mounting holes in the mounting flanges of the support structures. Therefore, the electronic components can be mounted to the mounting flanges at a number of vertical positions, and a number of electronic components can be mounted to the support structure, in essentially a vertical column. In this manner, the electronic components are rigidly connected to the support structure.

Open support structures of such type are commonly called "racks" and may be free-standing and self-supporting, or may be affixed to external support structures (e.g., a floor and/or wall). Enclosed support structures of such type are commonly called "cabinets" and are typically free-standing and self-supporting. Cabinets may include doors and/or side panels, which may or may not be removable.

To ensure compatibility between the racks and cabinets and the electronic components (and panels thereof), the Electronics Industries Association (EIA) has published a standard entitled "Cabinets, Racks, Panels, and Associated Equipment." This standard has also been accepted by the American National Standard association and has been designated ANSI/EIA-310-D (1992), and will be referred to herein as the "EIA Standard." The disclosure of the EIA Standard is incorporated herein by reference.

The EIA Standard specifies, among other things, a certain number of acceptable widths for electronic components and the support structure. In particular the EIA Standard specifies the horizontal center-to-center distances between the mounting holes of the mounting flanges of the support structures, and between the mounting slots on either side of the panels of the electronics components (which will be referred to herein as the "mounting hole distance"), such that the mounting panels of the electronics components can be consistently mounted to the mounting flanges. The standard also specifies a customary unit of measure for the height of electronics component panels which is termed a "modular unit" or "U" for short. A "U" is equal to approximately 1.75" or 44.45 mm.

The EIA Standard specifies that the "mounting hole distance" be either 465 mm, 592 mm or 745 mm (within a 6 mm tolerance), which is equivalent to 18.31 in, 23.31 in or 29.33 in (¼ in tolerance). Cabinets and racks which conform to the 465 mm (18.31 in) standard are typically called "19 inch" cabinets (or racks). Cabinets and racks which conform to the 592 m (23.31 in) standard are typically called "23 inch" cabinets (or racks). Similarly, electronics components are commonly designated by the terms "19 inch" or "23 inch".

In addition, EIA Standard specifies the vertical spacing, or pitch, between the mounting holes of the mounting flanges of the support structure. "Universal" spacing requires a repeating sequence of spacing of 15.9 mm, 15.9 mm and 12.7 mm, or ⅝th in, ⅝th in and ½ in. "Wide" spacing requires a repeating sequence of spacing of 31.8 mm and 12.7 mm, or 1¼ in and ½ in.

The EIA Standard also specifies the vertical locations of mounting holes in the panels of the electronic components, which locations depend upon the height of the panel (e.g., 1U, 2U . . . 12U), and depend upon the spacing of the mounting holes of the mounting flanges (either "Universial" or "Wide"). The mounting slots of the panels can be "open" (i.e., extending to the edge of the panels) or "closed" (i.e., holes). "Closed" mounting slots are specified as ovals having a maxiumum horizontal length of 10.3 mm (+/−0.4 mm) and a maximum vertical height of 7.1 mm (+/−0.3 mm). "Open" mounting slots of the panels are specified as having a horizontal depth of 14.7 mm from the edge of the panel and a vertical height of 7.1 mm (+/−0.3 mm). The panels are specified as having a maximum horizontal width of either 482.6 mm, 609.6 mm or 762.0 mm (+/−0.4 mm).

Electronic equipment cabinets and racks manufactured according to the EIA Standard are widely used, however, they are limited to providing support for electronic components of one width (e.g., either the 19" standard or the 23" standard).

The present invention provides a cabinet system which can be easily configured to support electronic components which conform to the width specifications of the EIA Standard (e.g., 19" or 23") as well as components which do not conform to the width specifications. For example, a cabinet constructed according to the present invention can be configured to support and house one electronic component conforming with the 19" width standard (e.g., a network "hub", a second electronic component conforming with the 23" standard (e.g., a network cable "patch panel"), and a third electronic component not conforming with any of the width standards (e.g., a "tower-form" network computer server.

As described in detail below the cabinet constructed according to the invention includes fixed support structure which supports intermediate support structure to which electronic components conforming to one of the width standards are mounted. The intermediate support structure can be located at a number of locations within the fixed support structure to provide for various arrangements of conforming electronic components and can be configured to support components conforming to more than one of the width specifications of the EIA Standard. Electronic components not conforming to the width specifications are supported on shelves mounted to the fixed support structure, which shelves can be mounted in a number of positions.

BRIEF DESCRIPTION OF THE DRAWINGS

For a complete understanding of the above and other features of the invention, reference shall be made to the following detailed description of the preferred embodiments of the invention and to the accompanying drawings, wherein.

DETAILED DESCRIPTION OF THE INVENTION

Figure 1:
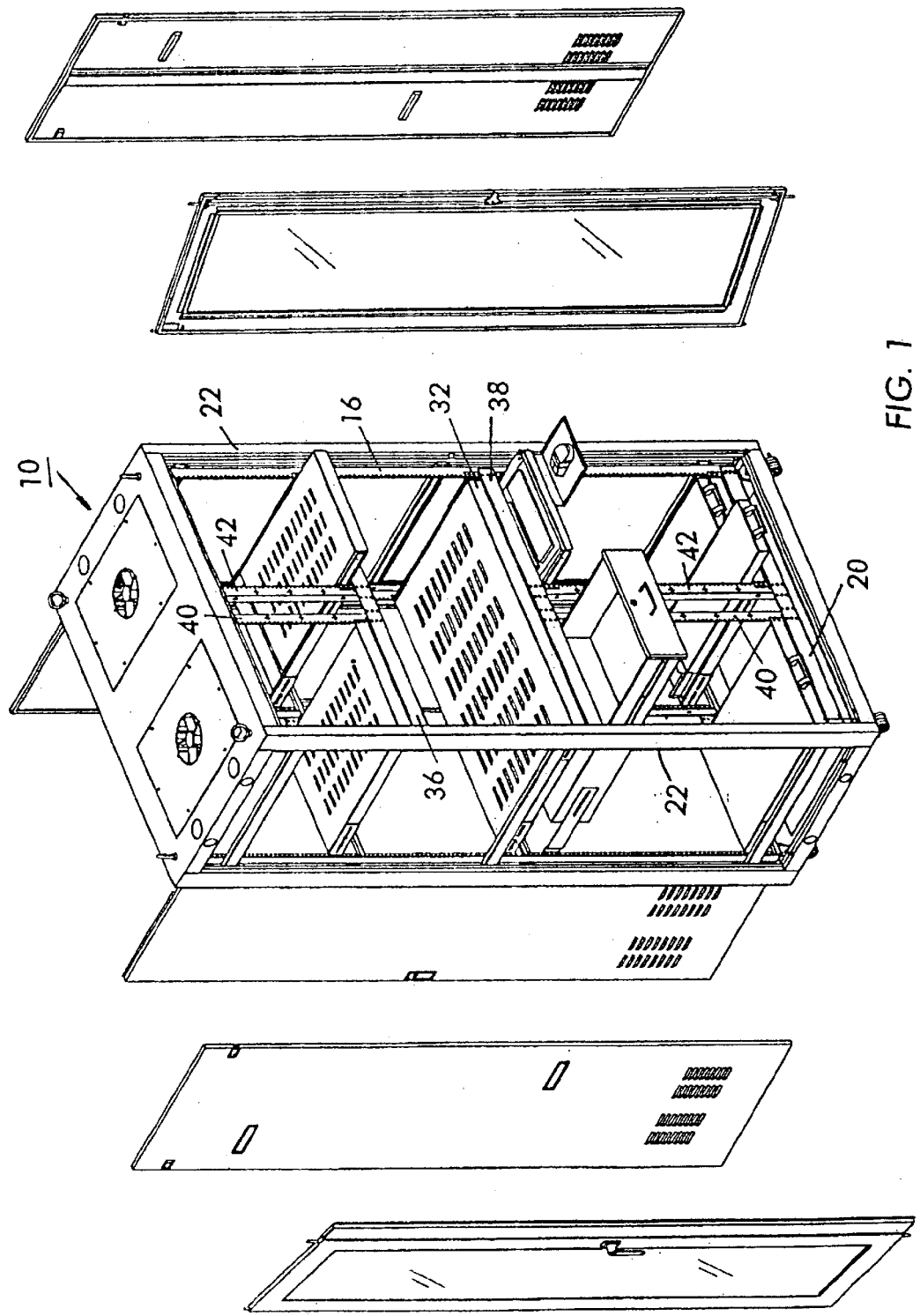
FIG. 1 is an perspective, assembly view of an electronic component cabinet constructed according to the invention.
Figure 2:
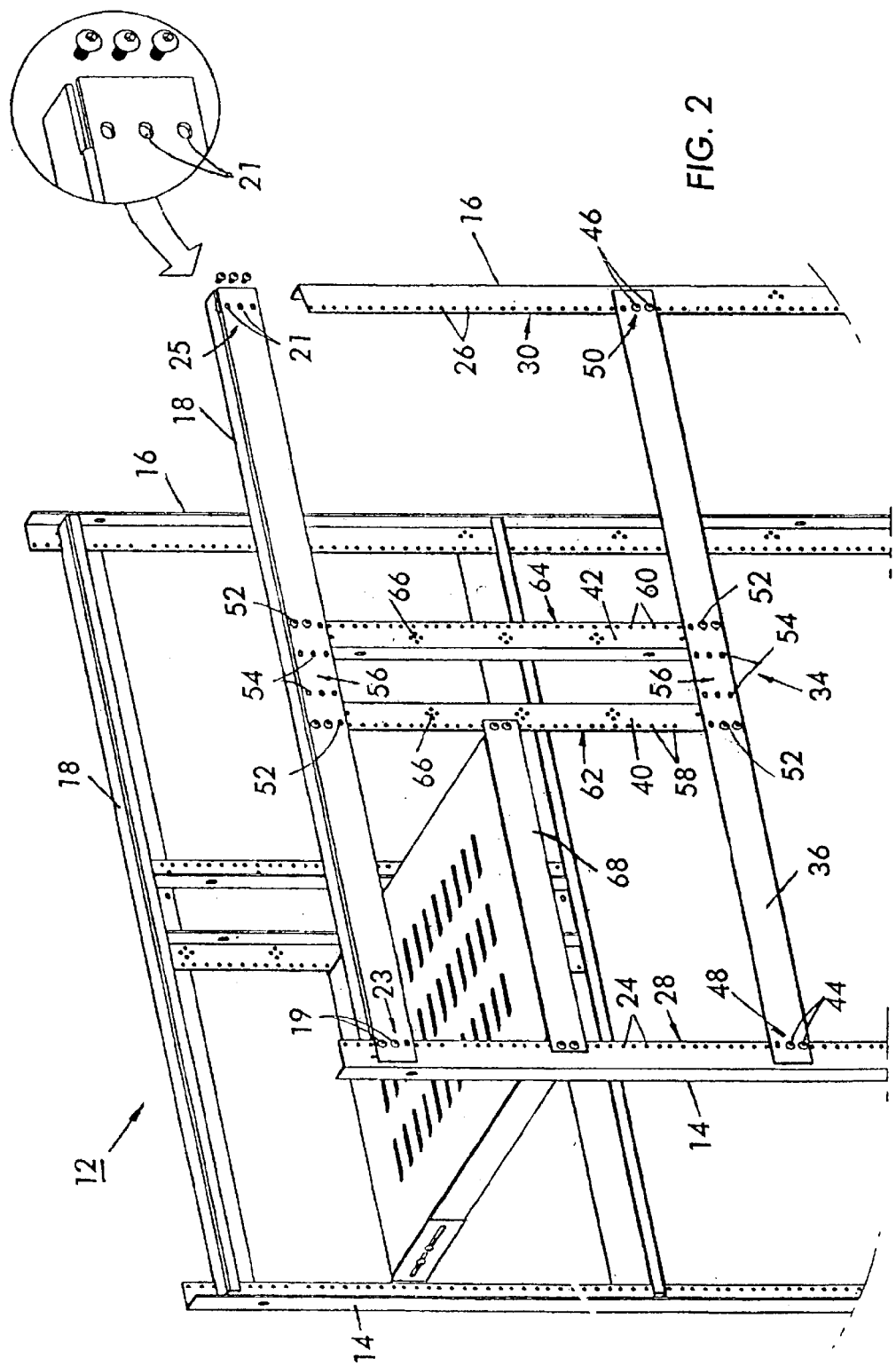
FIG. 2 is a perspective view of the fixed support structure and the intermediate support structure of the cabinet of FIG. 1.

Referring to FIGS. 1 and 2, an electronic component cabinet 10 constructed according to the present invention includes a fixed support structure, generally designated by the element number 12, which includes fixed vertical support members 14, 16, and fixed horizontal support members 18, 20.

The cabinet 10 also has intermediate support structure, generally designated by the element number 34, which includes intermediate horizontal support members 36, 38 and intermediate vertical support members 40, 42. The intermediate horizontal and vertical support members can be installed or removed from the cabinet 10 without disturbing the structural integrity of the cabinet 10 or of the fixed support structure 12 thereof. The intermediate support structure 34 can be arranged in a wide variety of configurations as desired by the user to support various combinations of electronic components, some of which conform to the EIA Standard and some of which do not.

The fixed horizontal support members 18, 20 are interconnected between the vertical support members 14, 16, forming the fixed support structure 12. The fixed support structure 12 is connected to a frame 22 of the cabinet 10. The fixed vertical support members 14, 16 include mounting holes 24, 26 located adjacent inside edges 28, 30 thereof. The mounting holes 24, 26 comply with the geometric specifications and the vertical spacing specifications of the EIA Standard, and are disposed along substantially the entire length of the fixed vertical support members 14, 16. The horizontal center-to-center distance between the mounting holes 24 of one of the vertical support members 14 and the mounting holes 26 of the opposite vertical support member 16 is substantially greater than the maximum width standard specified by the EIA Standard, and is preferably greater than twice the specified "23 inch" width standard.

Preferably, the fixed horizontal support members 18, 20 include mounting holes 19, 21 adjacent end portions 23, 25 thereof, which mounting holes 19, 21 comply with the geometric specifications and the vertical spacing specifications of the EIA and align with the mounting holes 24, 26 of the fixed vertical support members 14, 16, such that the fixed horizontal support members 18, 20 can be readily attached the fixed vertical support members 14, 16.

The cabinet 10 preferably includes a shelf 32 mounted to the vertical support members 14, 16 for supporting electronic components which exceed the width standards specified by the EIA Standard, or for supporting electronic components which lack a mounting plate and are therefore not "rack-mountable."

The intermediate horizontal support members 36, 38 are interconnected between the fixed vertical support members 14, 16. Preferably, the intermediate horizontal support members 36, 38 include mounting holes 44, 46 located adjacent end portions 48, 50 thereof, which mounting holes 44 comply with the geometric specifications and the vertical spacing specifications of the EIA Standard and align with the mounting holes 24, 26 of the fixed vertical support members 14, 16. Thus, the intermediate horizontal support members 36, 38 can be attached to the fixed support structure in a convenient manner and in a plurality of vertical locations. The intermediate horizontal support members 36, 38 also include a plurality of sets of pre-formed attachment holes 52, 54, located adjacent a center portion 56 thereof, for attachment of the intermediate vertical support members 40,42.

The intermediate vertical support members 40, 42 include mounting holes 58, 60 located adjacent inside edges 62, 64 thereof. The mounting holes 58, 60 comply with the geometric specifications and the vertical spacing specifications of the EIA Standard, and are disposed along substantially the entire length of the intermediate vertical support members 40, 42. As shown, the intermediate vertical support members 40, 42 can also include wire management apparatus mounting holes 66.

Preferably, the pre-formed attachment holes 52, 54, located adjacent the center portion 56 of the intermediate horizontal support members 36, 38 comply with the geometric specifications and the vertical spacing specifications of the EIA Standard such that the pre-formed attachment holes 52, 54 can be used to attach the intermediate vertical support members 40, 42 to the intermediate horizontal support members 36, 38 via the mounting holes 58, 60 in the intermediate vertical support members 40, 42.

The intermediate vertical support members 40, 42 can be attached, at one end, to one of the intermediate horizontal support members, and at the other end, to either a second intermediate horizontal support member (not shown) or to one of the fixed horizontal support members (as depicted in the drawings). In either case, the intermediate vertical support members 40, 42 are affixed in a substantially vertical orientation, parallel to the fixed vertical support members. Preferably, the intermediate vertical support members 40, 42 are provided in predetermined, graduated lengths substantially equal to integer multiples of the "modular unit" ("U") of the EIA Standard, for example in length substantially equal to 4U, 7U, 14U, etc.

A first (outer) set of pre-formed attachment holes 52 of the intermediate horizontal members are located such that, when an intermediate vertical support member 40, 42 is attached thereto, a horizontal center-to-center distance between the mounting holes 24, 26 an associated fixed vertical support member 14, 16 and the mounting holes 58, 60 the intermediate vertical support member 40, 42 is substantially equal to a first one of the predetermined mounting hole distances of the EIA Standard (e.g., the "19 inch" standard). Likewise, a second (inner) set of pre-formed attachment holes 54 of the intermediate horizontal members are located such that, when an intermediate vertical support member 40, 42 is attached thereto, a horizontal center-to-center distance between the mounting holes 24, 26 of an associated fixed vertical support member 14, 16 and the mounting holes 58, 60 the intermediate vertical support member 40, 42 is substantially equal to a second one of the predetermined mounting hole distances of the EIA Standard (e.g., the "23 inch" standard). The fixed horizontal support members 18, 20 include pre-formed attachment holes 62, 64 substantially identical to those of the intermediate horizontal support members. As can be appreciated, the pre-formed attachment holes of the fixed, and intermediate horizontal support members allow the intermediate vertical support members 40, 42 to be mounted thereto at the proper location with ease and consistency.

In use, the fixed support structure 12 of the cabinet 10 is substantially permanently connected to a frame 22 of the cabinet 10 and is intended to remain unchanged. It is intended that the intermediate support structure 34 be changed and configured by the user as desired to adapt the cabinet 10 to support both conforming and non-conforming electronic components. To support electronic components which do not conform to the EIA Standard, such as wide-format computer network server (such as a parallel-processor server), the user can attached a (full-width) shelf 32 between the fixed vertical support members 14, 16, thereby providing a relatively wide support base for the non-conforming component. To support a rack-mountable electronic component (such as a computer network "concentrator" having a standard-conforming face panel) in the same cabinet, the user can install an intermediate horizontal support member between the fixed vertical support member, and then attach an intermediate vertical support member at the appropriate location, to provide properly-spaced mounting holes for mounting the conforming component. As shown, multiple intermediate horizontal support members and intermediate vertical support members can be used to provide a plurality of locations to mount standard-conforming components.

As depicted, it is possible to include many other types of support structure in a cabinet constructed according to the invention, including a relatively narrow shelf 68 mounted between an intermediate vertical support member and a fixed vertical support member, drawers mounted underneath the intermediate horizontal support members, and sliding shelves.

It should be understood, of course, that the specific form of the invention herein illustrated and described is intended to be representative only, as certain changes may be made therein without departing from the clear teachings of the disclosure. Specifically, the example of the invention described in the above disclosure is that of a cabinet. However, it is intended that the present invention is equally applicable to rack-type structures, whether free-standing or affixed to external supporting structure. Accordingly, reference should be made to the following appended claims in determining the full scope of the invention.

I claim:

1. A telecommunications cabinet system for supporting a conforming telecommunications component conforming to a predefined geometric standard and for simultaneously supporting a nonconforming telecommunications component not conforming to said predefined geometric standard, the cabinet system comprising:
   (a) said conforming telecommunications component including a mounting panel fixedly attached thereto, said mounting panel having first and second vertical edges and having at least one panel mounting hole located adjacent each of said first and second vertical side edges, a horizontal center-to-center distance between said panel mounting holes being equal to a predetermined mounting hole distance of said predefined geometric standard;
   (b) a telecommunication cabinet having:
      (i) a fixed frame including first and second fixed, vertical frame members and first and second, fixed horizontal frame members interconnecting said first and second vertical frame members;
      (ii) each of said first and second vertical frame members having a set of mounting holes located along a substantial length thereof, and a horizontal center-to-center distance between said sets of mounting holes of said first and second vertical frame members, respectively, being substantially greater than said predetermined mounting hole distance;
      (iii) an intermediate horizontal support member interconnected between said first and second vertical frame members, said intermediate horizontal support member being located intermediate said first and second horizontal frame members, and being attachable to said first and second vertical frame members at a plurality of vertical locations along a substantial portion of the length thereof;
      (iv) an intermediate vertical frame member connected to said intermediate horizontal support member, said intermediate vertical support member being fixed in a vertical orientation and being located intermediate said first and second vertical frame members, and said intermediate vertical support member including a set of mounting holes located along a substantial length thereof;
      (v) a horizontal center-to-center distance between said set of mounting holes of said intermediate vertical support member and a set of mounting holes one of said first and second vertical frame members being substantially equal to said predetermined mounting hole distance; and
      (vi) a shelf interconnected between said first and second vertical support members, said shelf being attachable to said first and second vertical frame members at a plurality of vertical locations along a substantial portion of their length;
   (c) said mounting panel of said conforming telecommunications component being mounted to said intermediate vertical support member and to said one vertical frame member via fasteners directed through said panel mounting holes and through said mounting holes of said intermediate vertical support member and said one vertical frame member such that said conforming telecommunications component is supported by said intermediate vertical support member and said one vertical frame member; and
   (d) said nonconforming telecommunications component being supported on said shelf;
   (e) whereby said telecommunications cabinet system can be configured to support a rack-mountable telecommunications component conforming to said predefined geometric standard and to simultaneously support a telecommunications component not conforming to said predefined geometric standard, and whereby said conforming telecommunications component and said nonconforming telecommunications component can be located in a plurality of vertical positions as desired to accommodate and house various combinations of conforming and nonconforming telecommunications components.

2. A telecommunications cabinet system as in claim 1, wherein said intermediate vertical support member is interconnected between said intermediate horizontal frame member and one of said first and second fixed horizontal frame members.

3. A telecommunications cabinet system as in claim 1, wherein:
   (a) said intermediate horizontal support member includes at least one pre-formed attachment hole;
   (b) said intermediate vertical support member includes at least one pre-formed attachment hole;
   (c) a fastener directed through said pre-formed attachment holes of said intermediate horizontal support member and said intermediate vertical support member, respectively; and
   (d) said pre-formed attachment hole of said intermediate horizontal support member is located such that said center-to-center horizontal distance between said sets of mounting holes of said intermediate vertical support member and said one vertical frame member is equal to said predetermined mounting hole distance;

(e) whereby said pre-formed attachment holes allow said intermediate vertical support member to be attached to said intermediate horizontal support member at a proper location to permit mounting of said conforming telecommunications component.

4. A telecommunications cabinet system as in claim 2, wherein:

(a) each of said intermediate horizontal support member and said one fixed horizontal support member includes at least one pre-formed attachment hole;

(b) said intermediate vertical support member includes first and second ends and at least one pre-formed attachment hole located adjacent each of said first and second ends;

(c) a fastener directed through said pre-formed attachment holes of said intermediate horizontal support member and of said first end of said intermediate vertical support member, respectively, and a fastener directed through said pre-formed attachment holes of said one fixed horizontal frame member and of said second end of said intermediate vertical support member, respectively; and (d) said pre-formed attachment holes of said intermediate horizontal support member and of said one fixed horizontal frame member are located such that said center-to-center horizontal distance between said sets of mounting holes of said intermediate vertical support member and said one vertical frame member is equal to said predetermined mounting hole distance;

(e) whereby said pre-formed attachment holes allow said intermediate vertical support member to be attached to said intermediate horizontal support member and said one horizontal frame member at a proper location to permit mounting of said conforming telecommunications component.

5. A telecommunications cabinet system for supporting a conforming telecommunications component conforming to a predefined geometric standard and for simultaneously supporting a nonconforming telecommunications component not conforming to said predefined geometric standard, the cabinet system comprising:

(a) said conforming telecommunications component including a mounting panel fixedly attached thereto, said mounting panel having first and second vertical edges and having at least one panel mounting hole located adjacent each of said first and second vertical side edges, a horizontal center-to-center distance between said panel mounting holes being equal to a predetermined mounting hole distance of said predefined geometric standard;

(b) a telecommunication cabinet having:

(i) a fixed frame including first and second fixed, vertical frame members and first and second, fixed horizontal frame members interconnecting said first and second vertical frame members;

(ii) each of said first and second vertical frame members having a set of mounting holes located along a substantial length thereof, and a horizontal center-to-center distance between said sets of mounting holes of said first and second vertical frame members, respectively, being substantially greater than said predetermined mounting hole distance;

(iii) first and second intermediate horizontal support members interconnected between said first and second vertical frame members, said first and second intermediate horizontal supports member being located intermediate said first and second horizontal frame members, and being attachable to said first and second vertical frame members at a plurality of vertical locations along a substantial portion of the length thereof;

(iv) an intermediate vertical support member connected to said first and second intermediate horizontal support members, said intermediate vertical frame member being fixed in a vertical orientation and being located intermediate said first and second vertical frame members, and said intermediate vertical support member including a set of mounting holes located along a substantial length thereof;

(v) a horizontal center-to-center distance between said set of mounting holes of said intermediate vertical support member and a set of mounting holes one of said first and second vertical frame members being substantially equal to said predetermined mounting hole distance; and (vi) a shelf interconnected between said first and second vertical frame members, said shelf being attachable to said first and second vertical frame members at a plurality of vertical locations along a substantial portion of their length;

(c) said mounting panel of said conforming telecommunications component being mounted to said intermediate vertical support member and to said one vertical frame member via fasteners directed through said panel mounting holes and through said mounting holes of said intermediate vertical support member and said one vertical frame member such that said conforming telecommunications component is supported by said intermediate vertical support member and said one vertical frame member; and (d) said nonconforming telecommunications component being supported on said shelf;

(e) whereby said telecommunications cabinet system can be configured to support a rack-mountable telecommunications component conforming to said predefined geometric standard and to simultaneously support a telecommunications component not conforming to said predefined geometric standard, and whereby said conforming telecommunications component and said nonconforming telecommunications component can be located in a plurality of vertical positions as desired to accommodate and house various combinations of conforming and nonconforming telecommunications components.

6. A telecommunications cabinet system as in claim 5, wherein:

(a) said first and second intermediate horizontal support members each includes at least one pre-formed attachment hole;

(b) said intermediate vertical support member includes first and second ends and includes at least one pre-formed attachment hole located adjacent each of said first and second ends, respectively;

(c) a fastener directed through said pre-formed attachment holes of said first intermediate horizontal support member and of said first end of said intermediate vertical support member, respectively, and a fastener directed through said pre-formed attachment holes of said second intermediate horizontal support member and of said second end of said intermediate vertical support member, respectively; and (d) said pre-formed attachment holes of said first and second intermediate horizontal support members are located such that said center-to-center horizontal distance between said sets of mounting holes of said intermediate vertical support member and said one vertical frame member is equal to said predetermined mounting hole distance;

(e) whereby said pre-formed attachment holes allow said intermediate vertical support member to be attached to said first and second intermediate horizontal support members at a proper location to permit mounting of said conforming telecommunications component.

7. A telecommunications cabinet system for supporting a conforming telecommunications component conforming to a predefined geometric standard and for simultaneously supporting a nonconforming telecommunications component not conforming to said predefined geometric standard, the cabinet system comprising:

(a) said conforming telecommunications component including a mounting panel fixedly attached thereto, said mounting panel having first and second vertical edges and having at least one panel mounting hole located adjacent each of said first and second vertical side edges, a horizontal center-to-center distance between said panel mounting holes being equal to one of a first or second predetermined mounting hole distance of said predefined geometric standard;

(b) a telecommunication cabinet having:

(i) a fixed frame including first and second fixed, vertical frame members and first and second, fixed horizontal frame members interconnecting said first and second vertical frame members;

(ii) each of said first and second vertical frame members having a set of mounting holes located along a substantial length thereof, and a horizontal center-to-center distance between said sets of mounting holes of said first and second vertical frame members, respectively, being substantially greater than each said first and second predetermined mounting hole distance;

(iii) an intermediate horizontal support member interconnected between said first and second vertical frame members, said intermediate horizontal support member being located intermediate said first and second horizontal frame members, and being attachable to said first and second vertical frame members at a plurality of vertical locations along a substantial portion of the length thereof;

(iv) an intermediate vertical support member connected to said intermediate horizontal support member, said intermediate vertical support member being fixed in a vertical orientation and being located intermediate said first and second vertical frame members, and said intermediate vertical support member including a set of mounting holes located along a substantial length thereof;

(v) a horizontal center-to-center distance between said set of mounting holes of said intermediate vertical support member and a set of mounting holes of one of said first and second vertical frame members being substantially equal to said first or second predetermined mounting hole distance; and (vi) a shelf interconnected between said first and second vertical frame members, said shelf being attachable to said first and second vertical frame members at a plurality of vertical locations along a substantial portion of their length;

(c) said mounting panel of said conforming telecommunications component being mounted to said intermediate vertical support member and to said one vertical frame member via fasteners directed through said panel mounting holes and through said mounting holes of said intermediate vertical support member and said one vertical frame member such that said conforming telecommunications component is supported by said intermediate vertical support member and said one vertical frame member; and (d) said nonconforming telecommunications component being supported on said shelf;

(e) said intermediate horizontal support member includes first and second pre-formed attachment holes;

(f) said intermediate vertical support member includes at least one pre-formed attachment hole;

(g) a fastener directed through said first or second pre-formed attachment holes of said intermediate horizontal support member and through said pre-formed attachment hole of said intermediate vertical support member, respectively; and (h) said first pre-formed attachment hole of said intermediate horizontal support member is located such that said center-to-center horizontal distance between said sets of mounting holes of said intermediate vertical frame member and said one vertical support member is equal to said first predetermined mounting hole distance, and said second pre-formed attachment hole of said intermediate horizontal support member is located such that said center-to-center horizontal distance between said sets of mounting holes of said intermediate vertical support member and said one vertical frame member is equal to said second predetermined mounting hole distance;

(i) whereby said telecommunications cabinet system can be configured to support a rack-mountable telecommunications component conforming to said first or second predetermined mounting hole distance of said predefined geometric standard and to simultaneously support a telecommunications component not conforming to said predefined geometric standard, and whereby said conforming telecommunications component and said nonconforming telecommunications component can be located in a plurality of vertical positions as desired to accommodate and house various combinations of conforming and nonconforming telecommunications components, and whereby said pre-formed attachment holes allow said intermediate vertical support member to be attached to said intermediate horizontal support member at a proper location to permit mounting of said conforming telecommunications component.

* * * * *